(12) United States Patent
Maksymova et al.

(10) Patent No.: US 11,573,300 B2
(45) Date of Patent: Feb. 7, 2023

(54) EXTENDED DELTA ENCODING TECHNIQUE FOR LIDAR RAW DATA COMPRESSION

(71) Applicant: Infineon Technologies AG, Neubiberg (DE)

(72) Inventors: Ievgeniia Maksymova, Graz (AT); Norbert Druml, Graz (AT)

(73) Assignee: Infineon Technologies AG, Neubiberg (DE)

( * ) Notice: Subject to any disclaimer, the term of this patent is extended or adjusted under 35 U.S.C. 154(b) by 875 days.

(21) Appl. No.: 16/458,712

(22) Filed: Jul. 1, 2019

(65) Prior Publication Data

US 2021/0003677 A1 Jan. 7, 2021

(51) Int. Cl.
*G01S 17/10* (2020.01)
*G01S 7/4863* (2020.01)
*H04L 69/324* (2022.01)
*H03M 1/12* (2006.01)

(52) U.S. Cl.
CPC ............ *G01S 7/4863* (2013.01); *G01S 17/10* (2013.01); *H04L 69/324* (2013.01); *H03M 1/12* (2013.01)

(58) Field of Classification Search
None
See application file for complete search history.

(56) References Cited

U.S. PATENT DOCUMENTS

2017/0318068 A1* 11/2017 Kikkeri Shivadatta ..................... H04J 3/0632
2020/0110161 A1* 4/2020 Talty ..................... G01S 7/4808

* cited by examiner

*Primary Examiner* — Eileen M Adams
(74) *Attorney, Agent, or Firm* — Harrity & Harrity, LLP

(57) ABSTRACT

A Light Detection and Ranging (LIDAR) receiver includes a photodetector array configured to generate a plurality of electrical signals; a receiver circuit including a plurality of readout channels, configured to read out the plurality of electrical signals from the photodetector array, and a plurality of multibit ADCs, wherein each of the plurality of readout channels includes a different one of the plurality of multibit ADCs, and each of the plurality of multibit ADCs is configured to convert at least one of the plurality of electrical signals into an ADC data sample such that the plurality of multibit ADCs generate a sequence of ADC data samples; an encoder coupled to the plurality of readout channels and configured to receive the sequence of ADC data samples and generate a compressed data packet based on the sequence of ADC data samples; and a communication interface configured to transmit the compressed data packet.

20 Claims, 10 Drawing Sheets

EXTENDED DELTA ENCODING TECHNIQUE FOR LIDAR RAW DATA COMPRESSION

FIELD

The present disclosure relates generally to devices and methods for encoding and decoding data in a Light Detection and Ranging (LIDAR) system.

BACKGROUND

Light Detection and Ranging (LIDAR), is a remote sensing method that uses light in the form of a pulsed laser to measure ranges (variable distances) to one or more objects in a field of view. In particular, light is transmitted towards the object. Single photodetectors or arrays of photodetectors receive reflections from objects illuminated by the light, and the time it takes for the reflections to arrive at various sensors in the photodetector array is determined. This is also referred to as measuring time-of-flight (TOF). LIDAR systems form depth measurements and make distance measurements by mapping the distance to objects based on the time-of-flight computations. Thus, the time-of-flight computations can create distance and depth maps, which may be used to generate images.

Due to specific dynamics of the operating environment and required safety regulations, the amount of acquired data of an automotive LiDAR sensor that has to be processed is reaching several Gbit/s. Therefore, data compression is much-needed to enable future multi-sensor automated vehicles. Numerous techniques have been developed to compress LIDAR raw data; however, these techniques are primarily targeting a compression of three-dimensional (3D) point cloud, while the way data is captured and transferred from a sensor to an electronic computing unit is not addressed.

Therefore, an improved device having an improved way of compressing IDAR raw data may be desirable.

SUMMARY

Embodiments provide systems and methods for encoding and decoding raw TOF sensor data, and, more particularly, for encoding and decoding raw LIDAR sensor data.

According to one or more embodiments, a Light Detection and Ranging (LIDAR) system includes a LIDAR receiver. The LIDAR receiver includes a photodetector array configured to generate a plurality of electrical signals based on receiving a reflected light beam; a receiver circuit including a plurality of readout channels configured to read out the plurality of electrical signals from the photodetector array and a plurality of multibit analog-to-digital converters (ADCs), wherein each of the plurality of readout channels includes a different one of the plurality of multibit ADCs, and each of the plurality of multibit ADCs is configured to convert at least one of the plurality of electrical signals into an ADC data sample such that the plurality of multibit ADCs generate a sequence of ADC data samples; an encoder coupled to the plurality of readout channels and configured to receive the sequence of ADC data samples and generate a compressed data packet based on the sequence of ADC data samples; and a communication interface configured to transmit the compressed data packet.

According to one or more embodiments, a method of encoding Light Detection and Ranging (LIDAR) data is provided. The method includes generating, by a photodetector array, a plurality of electrical signals based on receiving a reflected light beam; reading out the plurality of electrical signals from the photodetector array using a plurality of readout channels, each comprising a different multibit analog-to-digital converter (ADC) of a plurality of multibit ADCs; converting, by the plurality of multibit ADCs, the plurality of electrical signals into a plurality of ADC data samples that make up a sequence of ADC data samples; and encoding the sequence of ADC data samples to generate a compressed data packet.

BRIEF DESCRIPTION OF THE DRAWINGS

Embodiments are described herein making reference to the appended drawings.

DETAILED DESCRIPTION

Figure 1:
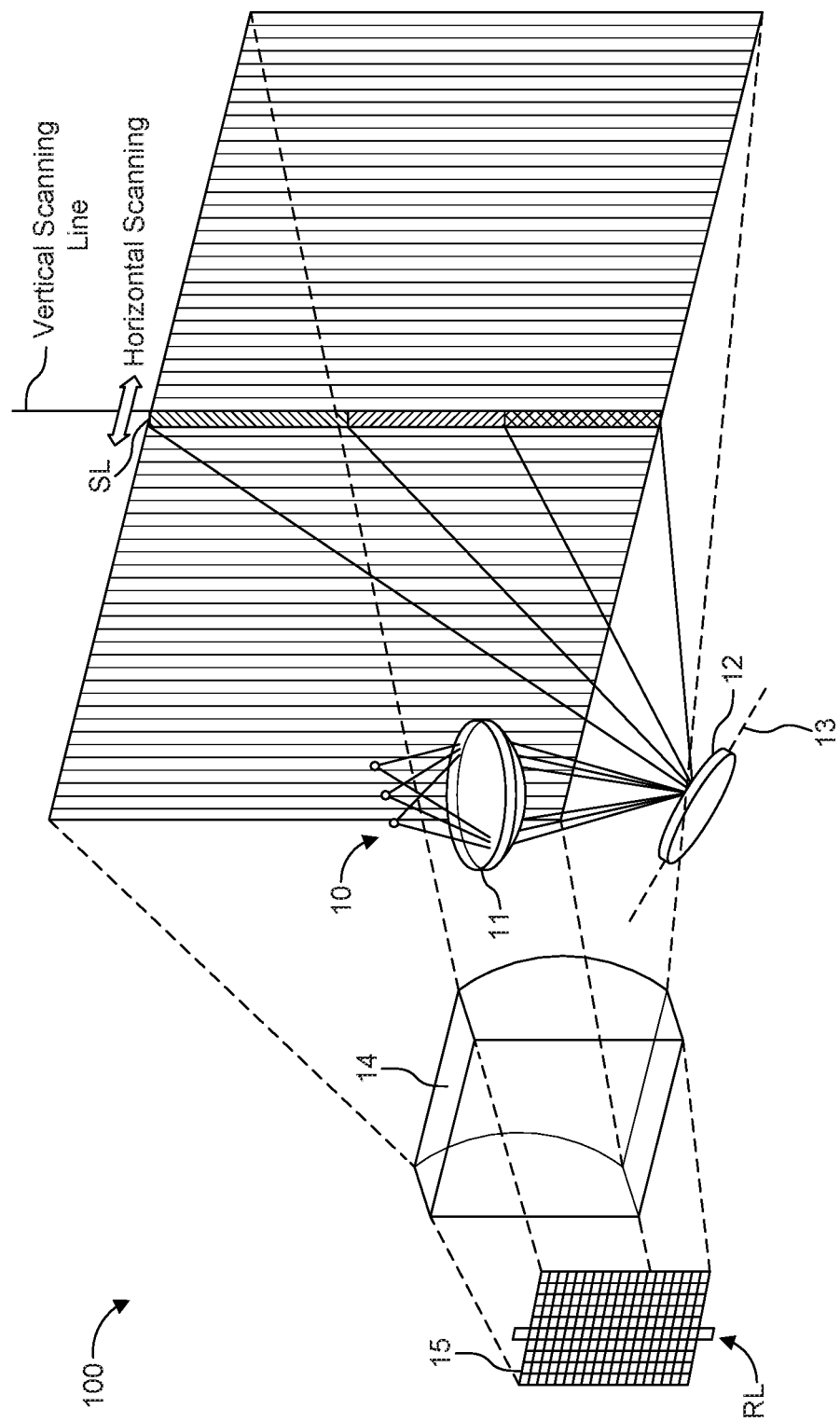
FIG. 1 is a schematic diagram of a LIDAR scanning system in accordance with one or more embodiments.

In the following, various embodiments will be described in detail referring to the attached drawings. It should be noted that these embodiments serve illustrative purposes only and are not to be construed as limiting. For example, while embodiments may be described as comprising a plurality of features or elements, this is not to be construed as indicating that all these features or elements are needed for implementing embodiments. Instead, in other embodiments, some of the features or elements may be omitted, or may be replaced by alternative features or elements. Additionally, further features or elements in addition to the ones explicitly shown and described may be provided, for example conventional components of sensor devices.

Features from different embodiments may be combined to form further embodiments, unless specifically noted otherwise. Variations or modifications described with respect to one of the embodiments may also be applicable to other embodiments. In some instances, well-known structures and devices are shown in block diagram form rather than in detail in order to avoid obscuring the embodiments.

Connections or couplings between elements shown in the drawings or described herein may be wire-based connections or wireless connections unless noted otherwise. Furthermore, such connections or couplings may be direct connections or couplings without additional intervening elements or indirect connections or couplings with one or more additional intervening elements, as long as the general purpose of the connection or coupling, for example to transmit a certain kind of signal or to transmit a certain kind of information, is essentially maintained.

Embodiments relate to optical sensors and optical sensor systems and to obtaining information about optical sensors and optical sensor systems. A sensor may refer to a component which converts a physical quantity to be measured to an electric signal, for example a current signal or a voltage signal. The physical quantity may, for example, comprise electromagnetic radiation, such as visible light, infrared (IR) radiation, or other type of illumination signal, a current, or a voltage, but is not limited thereto. For example, an image sensor may be a silicon chip inside a camera that converts photons of light coming from a lens into voltages. The larger the active area of the sensor, the more light that can be collected to create an image.

A sensor device as used herein may refer to a device which comprises a sensor and further components, for example biasing circuitry, an analog-to-digital converter or a filter. A sensor device may be integrated on a single chip, although in other embodiments a plurality of chips or also components external to a chip may be used for implementing a sensor device.

In Light Detection and Ranging (LIDAR) systems, a light source transmits light pulses into a field of view and the light reflects from one or more objects by backscattering. In particular, LIDAR is a direct Time-of-Flight (TOF) system in which the light pulses (e.g., laser beams of infrared light) are emitted into the field of view, and a pixel array detects and measures the reflected beams. For example, an array of photodetectors receives reflections from objects illuminated by the light.

Currently, a photodetector array may be used to measure the reflected light. The photodetector array may be a one-dimensional (1D) array that consists of multiple rows of photodetectors (pixels) arranged in a single column or a two-dimensional (2D) array that consists of multiple rows and columns of photodetectors arranged in a grid-like arrangement. Each pixel row or group of adjacent pixel rows may be readout as a measurement signal in the form of raw analog data. Each measurement signal may include data from a single pixel column or from two or more pixel columns corresponding to the selected pixel row or rows.

Differences in return times for each light pulse across multiple pixels of the pixel array can then be used to make digital 3D representations of an environment or to generate other sensor data. For example, the light source may emit a single light pulse, and a time-to-digital converter (TDC) electrically coupled to the pixel array may count from the time the light pulse is emitted, corresponding to a start signal, until a time the reflected light pulse is received at the receiver (i.e., at the pixel array), corresponding to a stop signal. The "time-of-flight" of the light pulse is then translated into a distance. In another example, an analog-to-digital converter (ADC) may be electrically coupled to the pixel array (e.g., indirectly coupled with intervening elements in-between) for pulse detection and ToF measurement. For example, an ADC may be used to estimate a time interval between start/stop signals with an appropriate algorithm.

A scan such as an oscillating horizontal scan (e.g., from left to right and right to left of a field of view) can illuminate a scene in a continuous scan fashion. Each firing of the laser beam by the light sources can result in a scan line in the "field of view." By emitting successive light pulses in different scanning directions, an area referred to as the field of view can be scanned and objects within the area can be detected and imaged. Thus, the field of view represents a scanning plane having a center of projection. A raster scan could also be used.

FIG. 1 is a schematic diagram of a LIDAR scanning system 100 in accordance with one or more embodiments. The LIDAR scanning system 100 is an optical scanning device that includes a transmitter, including an illumination unit 10, a transmitter optics 11, and a one-dimensional (1D) MEMS mirror 12 (1D MEMS scanner), and a receiver, including a primary optics 14, and an optical receiver 15. The optical receiver 15 in the illustration is a 2D photodetector array 15 but may alternatively be a 1D photodetector array. The receiver may further include receiver circuitry, such as data acquisition/readout circuitry and data processing circuitry, as will be further described according to FIG. 2.

While this arrangement represents one example of a type of a LIDAR system, it will be appreciated that other types of pulsed LIDAR systems, such as those used in flash LIDAR, may also be used. In addition, the LIDAR scanning system 100 may be rotated to scan in a different scanning direction. For example, the LIDAR scanning system 100 may be rotated 90° to scan in the vertical direction instead of the horizontal direction. Thus, the embodiments described herein are directed to light transmitters and TOF systems that use pulsed modulation for transmitting light pulses into a field of view. Pulsed modulation is a LIDAR technique that measures a distance to a 3D object by measuring the absolute time a light pulse takes to travel from a source into the 3D scene and back, after reflection. Signal encoding, as described herein, is performed by removing the DC constant during the signal encoding.

Turning back to FIG. 1, the photodetector array 15, whether it be a 2D array or a 1D array, is arranged in such a manner that an intended field of view is mapped vertically on the vertical extension of the photodetector array 15. A received light beam will hit only a specific row or group or rows of the detector array depending on the vertical angle of the received light beam. The intended field of view may be further mapped horizontally on the horizontal extension of a 2D photodetector array.

In this example, the illumination unit 10 includes three light sources (e.g., laser diodes or light emitting diodes) that are linearly aligned in single bar formation and are configured to transmit light used for scanning the field of view for objects. The light emitted by the light sources is typically infrared light although light with another wavelength might also be used. As can be seen in the embodiment of FIG. 1, the shape of the light emitted by the light sources is spread in a direction perpendicular to the transmission direction to form a light beam with an oblong shape perpendicular to a transmission direction. The illumination light transmitted from the light sources are directed towards the transmitter optics 11 configured to focus each laser onto a MEMS mirror 12 that scans in one dimension. The transmitter optics 11 may be, for example, a lens or a prism.

When reflected by the MEMS mirror 12, the light from the light sources are aligned vertically to form, for each emitted laser shot, a one-dimensional vertical scanning line SL of infrared light or a vertical bar of infrared light. Each light source of the illumination unit 10 contributes to a different vertical region of the vertical scanning line SL. Thus, the light sources may be concurrently activated and concurrently deactivated to obtain a light pulse with multiple vertical segments, where each vertical segment corresponds to a respective light source, However, each vertical region or segment of the vertical scanning line SL may also be independently active or inactive by turning on or off a corresponding one of the light sources of the illumination unit 10. Thus, a partial or full vertical scanning line SL of light may be output from the system 100 into the field of view.

Accordingly, the transmitter of the system 100 is an optical arrangement configured to generate laser beams based on the laser pulses, the laser beams having an oblong shape extending in a direction perpendicular to a transmission direction of the laser beams. As can be seen from FIG. 1, each of the light sources is associated with a different vertical region in the field of view such that each light source illuminates a vertical scanning line only into the vertical region associated with the light source. For example, the first light source illuminates into a first vertical region and the second light sources illuminates into a second vertical region which is different from the first vertical region.

In addition, while three laser sources are shown, it will be appreciated that the number of laser sources are not limited thereto. For example, the vertical scanning line SL may be generated by a single laser source, two laser sources or more than three laser sources.

The MEMS mirror 12 is a mechanical moving mirror (i.e., a MEMS micro-mirror) integrated on a semiconductor chip (not shown). The MEMS mirror 12 according to this embodiment is configured to rotate about a single scanning axis and can be said to have only one degree of freedom for scanning. Distinguished from 2D-MEMS mirrors (2D MEMS scanners), in the 1D MEMS mirror, the single scanning axis is fixed to a non-rotating substrate and therefore maintains its spatial orientation during the oscillation of the MEMS mirror. Due to this single scanning axis of rotation, the MEMS mirror 12 is referred to as a 1D MEMS mirror or 1D MEMS scanner.

The MEMS mirror 12 is configured to oscillate "side-to-side" about a single scanning axis 13 such that the light reflected from the MEMS mirror 12 (i.e., the vertical scanning line of light) oscillates back and forth in a horizontal scanning direction. A scanning period or an oscillation period is defined, for example, by one complete oscillation from a first edge of the field of view (e.g., left side) to a second edge of the field of view (e.g., right side) and then back again to the first edge. A mirror period of the MEMS mirror 12 corresponds to a scanning period.

Thus, the field of view is scanned in the horizontal direction by the vertical bar of light by changing the angle of the MEMS mirror 12 on its scanning axis 13. For example, the MEMS mirror 12 may be configured to oscillate between +/−15 degrees in a horizontal scanning direction to steer the light over +/−30 degrees (i.e., 60 degrees) making up the horizontal scanning range of the field of view. Thus, the field of view may be scanned, line-by-line, by a rotation of the MEMS mirror 12 though its degree of motion.

One such sequence though the degree of motion (e.g., from −15 degrees to +15 degrees or vice versa) is referred to as a single scan. Thus, two scans are used for each scanning period. Multiple scans may be used to generate distance and depth maps, as well as 3D images by a processing unit. The horizontal resolution of the depth maps and images depends on the size of the incremental steps in rotation angle of the MEMS mirror 12 taken between scans.

While the transmission mirror is described in the context of a MEMS mirror, it will be appreciated that other 1D mirrors or even 2D mirrors can also be used. In addition, the degree of rotation is not limited to +/−15 degrees, and the field of view may be increased or decreased according to the application. Thus, a one-dimensional scanning mirror is configured to oscillate about a single scanning axis and direct the laser beams at different directions into a field of view. Hence, a transmission technique includes transmitting the beams of light into the field of view from a transmission mirror that oscillates about a single scanning axis such that the beams of light are projected as a vertical scanning line SL into the field of view that moves horizontally across the field of view as the transmission mirror oscillates about the single scanning axis. LIDAR systems using 1D-scanning mirrors can use a more relaxed shot-rate of the illumination unit 10 (i.e., transmitter) compared to 2D-scanning mirrors which use laser points for scanning the field of view which requires more shots for the transmitter to scan a field of view. In addition, LIDAR systems using 1D-scanning mirrors are typically more robust against shock and vibrations when compared to 2D-scanning mirrors and are therefore well suited for automotive applications.

Upon impinging one or more objects, the transmitted bar of vertical light is reflected by backscattering back towards the LIDAR scanning system 100 as a reflected vertical line where the second optical component 14 (e.g., a lens or prism) receives the reflected light. The second optical component 14 directs the reflected light onto the photodetector array 15 that receives the reflected light as a receiving line RL and is configured to generate electrical measurement signals. The electrical measurement signals may be used for generating a 3D map of the environment and/or other object data based on the reflected light (e.g., via TOF calculations and processing).

The receiving line RL is shown as a vertical column of light that extends along one of the pixel columns in a lengthwise direction of the pixel column. The receiving line has three vertical regions that correspond to the vertical regions of the vertical scanning line SL shown in FIG. 1. As the vertical scanning line SL moves horizontally across the field of view, the vertical column of light RL incident on the 2D photodetector array 15 also moves horizontally across the 2D photodetector array 15. The reflected light beam RL moves from a first edge of the photodetector detector array 15 to a second edge of the photodetector detector array 15 as the receiving direction of the reflected light beam RL changes. The receiving direction of the reflected light beam RL corresponds to a transmission direction of the scanning line SL.

In a system that uses a 1D photodetector array instead of a 2D photodetector array, each light beam (i.e., each receiving line RL) is projected onto the column of the detector array.

The photodetector array 15 can be any of a number of photodetector types; including avalanche photodiodes (APD), photocells, and/or other photodiode devices. Imaging sensors such as charge-coupled devices (CCDs) can be the photodetectors. In the examples provided herein, the photodetector array 15 is a two-dimensional (2D) APD array that comprises an array of APD pixels. As noted above, the photodetector array 15 may be a 1D array that includes a single column of photodiodes. The activation of the photodiodes may be synchronized with light pulses emitted by the illumination unit 10.

The photodetector array 15 receives reflective light pulses as the receiving line RL and generates electrical signals in response thereto. Since the time of transmission of each light pulse from the illumination unit 10 is known, and because the light travels at a known speed, a time-of-flight computation using the electrical signals can determine the distance of objects from the photodetector array 15. A depth map can plot the distance information.

In one example, for each distance sampling, a microcontroller triggers a laser pulse from each of the light sources of the illumination unit 10 and also starts a timer in a Time-to-Digital Converter (TDC) Integrated Circuit (IC). The laser pulse is propagated through the transmission optics, reflected by the target field, and captured by one or more receiving photodiodes of the photodetector array 15. Each receiving photodiode emits a short electrical pulse that is read out by the analog readout circuit. Each signal that is read out of the analog readout circuit may be amplified by an electrical signal amplifier.

A comparator IC recognizes the pulse and sends a digital signal to the TDC to stop the timer. The TDC uses a clock frequency to calibrate each measurement. The TDC sends the serial data of the differential time between the start and stop digital signals to the microcontroller, which filters out any error reads, averages multiple time measurements, and calculates the distance to the target at that particular field position. By emitting successive light pulses in different directions established by the MEMS mirror 12, an area (i.e., a field of view) can be scanned, a three-dimensional image can be generated, and objects within the area can be detected.

The signal processing chain of the receiver may also include an ADC for each photodiode or for a group of photodiodes. The ADC is configured to convert the analog electrical signals from the photodiodes or group of photodiodes into a digital signal that is used for further data processing.

In addition, instead of using the TDC approach, ADCs may be used for signal detection and ToF measurement. For example, each ADC may be used detect an analog electrical signal from one or more photodiodes to estimate a time interval between a start signal (i.e., corresponding to a timing of a transmitted light pulse) and a stop signal (i.e., corresponding to a timing of receiving an analog electrical signal at an ADC) with an appropriate algorithm.

When a pulse of laser energy as a vertical scanning line SL enters the field of view from the surface of MEMS mirror 12, reflective pulses appear when the laser light illuminates an object in the field of view. These reflective pulses arrive at the photodetector array 15 as a vertical column of light that may, for example, have the width of one photodetector pixel, or less, and a length that spans vertically at least partially along a pixel column of the photodetector array 15 in a lengthwise direction. That is, all photodetector pixels in a pixel column or a portion of the photodetector pixels of the pixel column may receive the bar of light. For example, in one instance, all light sources of the illumination unit 10 may be used to generate the scanning line SL/receiving line RL. In this case, the receiving line RL may extend along a full pixel column in the lengthwise direction. In another instance, only a subset of the light sources may be used to generate the scanning line SL/receiving line RL. In this case, the receiving line may extend along only a portion of the pixel column in the lengthwise direction.

In some instances, two or more pixel columns may receive light from a same bar of light. For example, two pixel columns may receive light when a portion of the received bar of light impinges on an area between two photodetector pixels. In this case, two pixel columns may be partially illuminated by a single bar of light in the width direction.

On the other hand, if a partial vertical scanning line SL is generated by the illumination unit 10, as described above, then only a partial pixel column of the photodetector array 15 may be illuminated in a lengthwise direction.

The photodetector array 15 is configured to generate measurement signals (electrical signals) used for generating a 3D map of the environment based on the reflected light (e.g., via TOF calculations and processing). For example, as noted above, the photodetector array 15 may be a 2D array of photodiodes or other light detection component capable of detecting and measuring light, and generating electrical signals therefrom.

While not shown, the LIDAR scanning system 100 may also include a digital micromirror device (DMD) and a secondary optics (e.g., a lens, a total internal reflection (TIR) prism, or a beam splitter) that are configured to initially receive the reflected light through the primary optics 14, and redirect the received reflected light towards the photodetector array 15. For example, the DMD would first receive the reflected light pulse from the primary optics, and deflect the received reflected light through the secondary optics (e.g., a lens, a total internal reflection (TIR) prism, or a beam splitter) onto the photodetector array 15. In this case, the photodetector array 15 would still receive a vertical column of light, as described above.

Figure 2:
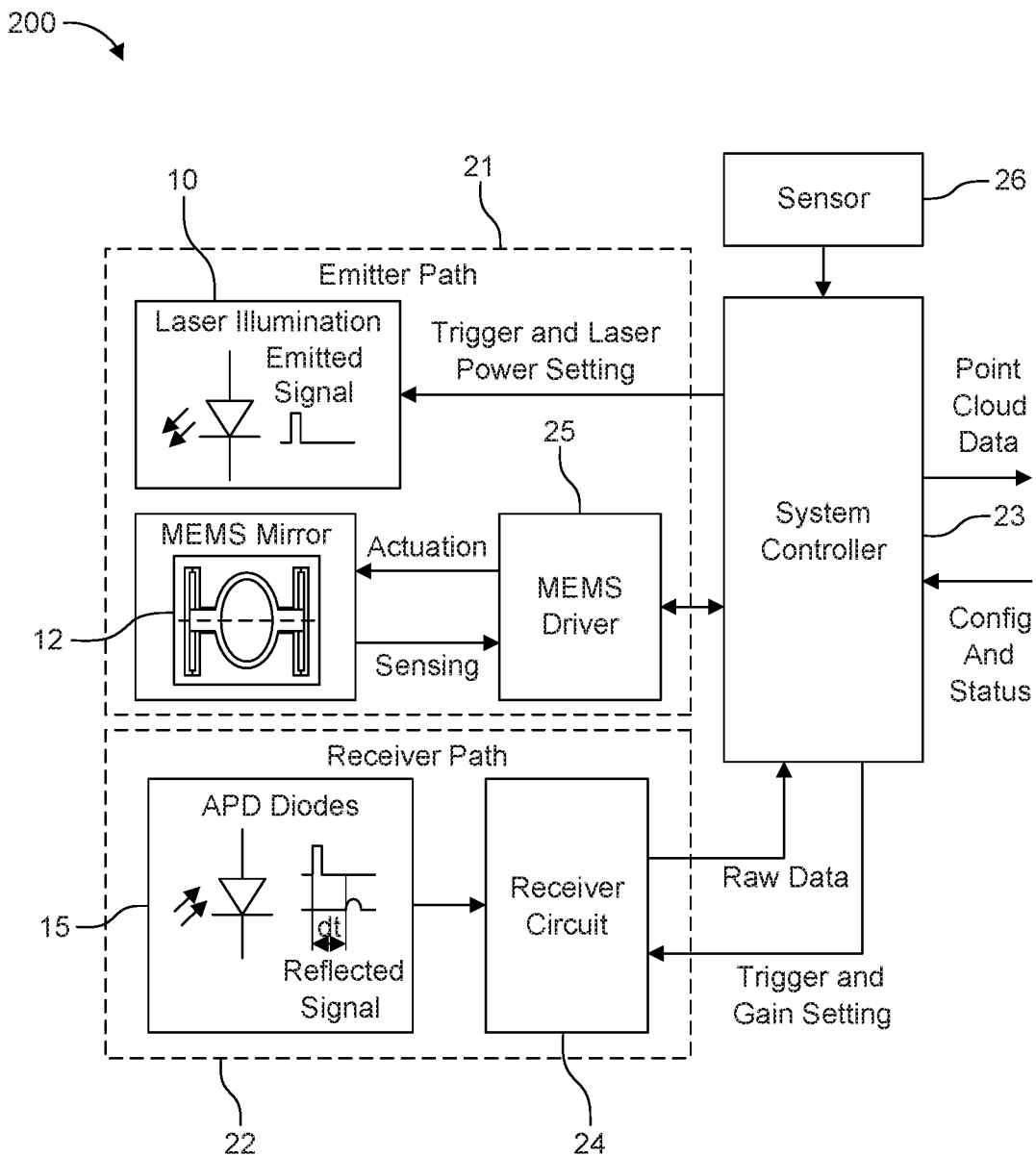
FIG. 2 is a schematic block diagram of a LIDAR scanning system in accordance with one or more embodiments.

FIG. 2 is a schematic block diagram of the LIDAR scanning system 200 in accordance with one or more embodiments. In particular, FIG. 2 shows additional features of the LIDAR scanning system 200, including example processing and control system components such as a MEMS driver, a receiver circuit, and a system controller.

The LIDAR scanning system 200 includes a transmitter unit 21 that is responsible for an emitter path of the system 200, and a receiver unit 22 that is responsible for a receiver path of the system 200. The system also includes a system controller 23 that is configured to control components of the transmitter unit 21 and the receiver unit 22, and to receive raw data from the receiver unit 22 and perform processing thereon (e.g., via digital signal processing) for generating object data (e.g., point cloud data). Thus, the system controller 23 includes at least one processor and/or processor circuitry (e.g., comparators and digital signal processors (DSPs)) of a signal processing chain for processing data, as well as control circuitry, such as a microcontroller, that is configured to generate control signals. The LIDAR scanning system 200 may also include a sensor 26, such as a temperature sensor, that provides sensor information to the system controller 23.

The transmitter unit 21 includes the illumination unit 10, the MEMS mirror 12, and a MEMS driver 25 configured to drive the MEMS mirror 12. In particular, the MEMS driver 25 actuates and senses the rotation position of the mirror, and provides position information (e.g., tilt angle or degree of rotation about the rotation axis) of the mirror to the system controller 23. Based on this position information, the laser sources of the illumination unit 10 are triggered by the system controller 23 and the photodiodes are activated to sense, and thus measure, a reflected light signal. Thus, a higher accuracy in position sensing of the MEMS mirror results in a more accurate and precise control of other components of the LIDAR system.

The receiver unit 22 includes the photodetector array 15 as well as a receiver circuit 24 that includes an analog readout circuit. As will be described in more detail below, each row of the photodetector array 15 may be selectively coupled and decoupled by an analog multiplexer to the receiver circuit 24. A pixel, a row, or a column that is coupled to the receiver circuit 24 may be referred to as active, while a pixel, a row, or a column that is not coupled to the receiver circuit 24 may be referred to as inactive.

The analog readout circuit includes N analog output channels (e.g., 32 channels) configured to read out measurement signals received from a selected pixel of a coupled row of the photodetector array 15. Furthermore, more than one pixel from a coupled row may be selected, multiple rows may simultaneously be coupled to an output channel, and one or more pixels may be selected from each coupled row. One acquisition of analog data from the photodetector array 15 on an analog output channel may be referred to as an analog sample, and each analog output channel may be used to acquire different analog samples. Each sample further corresponds to a sample time, at which time measurement signals are read out from one or more pixels.

Thus, the receiver circuit 24 may receive the analog electrical signals from the photodetectors of the photodetector array 15 and transmit the electrical signals as raw analog data to a multibit analog-to-digital converter (ADC). Prior to the multibit ADC receiving the electrical signals, the electrical signals from each channel may pass through a corresponding amplifier (e.g., a transimpedance amplifier (TIA)) of N amplifiers that converts the electrical signals from, for example, current into voltage. Thus, each TIA and each multibit ADC are incorporated in the receiver circuit 24. One acquisition of ADC data may be referred to as an ADC sample, which may also be referred to as a digital sample. Each sample further corresponds to a sample time, at which time measurement signals are read out from one or more pixels.

The ADC is configured to convert the raw analog data into raw digital data for transmission to the system controller 23, which performs further processing on the raw digital data, including generating 3D point cloud data. Thus, each of the analog output channels is coupled to a corresponding ADC of N ADCs that is configured to convert the analog data from a respective analog output channel into digital data. As a result, the receiver circuit 24 also includes a digital readout circuit of N digital output channels, each being coupled to a different corresponding analog output channel via a different corresponding ADC.

As will be described, the receiver circuit 24 also includes an encoder that is responsible for compressing the raw LIDAR data prior to transmitting the compressed data to the system controller 23. By doing so, the amount of data traffic between the receiver circuit 24 and the system controller 23 can be reduced. In addition, since the system controller 23 may need to evaluate full-waveform data, a lossless data rate reduction may be used for the compression. Thus, one or more embodiments are configured to enable the transfer of the full-waveform to the system controller 23.

The receiver circuit 24 may also receive trigger control signals from the system controller 23 that triggers an activation of one or more photodetectors. The receiver circuit 24 may also receive gain setting control signals for controlling the gain of one or more photodetectors.

The system controller 23 includes a decoder that decompresses the compressed data and signal processing circuitry that receives the decompressed raw digital data as well as serial data of a differential time between start and stop digital signals generated by an ADC, and uses the received data to calculate time-of-flight information for each field position within the field of view, to generate object data (e.g., point cloud data), and to generate a 3D point cloud.

Acquired LIDAR data includes data from a reflected object signal, originating from a LIDAR transmitted laser beam reflecting off an object, and a noise signal, originating from other light sources such as ambient light (e.g., from the sun). Under ideal weather conditions, most of LIDAR raw data could be considered as an ambient noise, which has smaller magnitude compared to a reflected object signal. The proposed data compression technique explores the nature of the LIDAR raw data and offers a data rate reduction by up to 33-34% when used to compress LIDAR data after ADC conversion at the receiver circuit 24, but prior to transmission to the system controller 23.

The compression ratio depends on the type of data pre-processing. For example, applying a matched filtering before the compression results in a 33% reduction independently from the signal-to-noise ration (SNR). Alternatively, a sample averaging over, for example, four samples, before the compression results in a 24-31% compression ratio depending on the SNR. The compression mode from among two or more compression modes can be selected by defining a compression ratio variable (bx) that corresponds to the number of compressible bits of a pre-ADC data sample. For example, if two compression modes exist, a compression ratio may be set by selecting and setting the compression ratio variable bx to two or three, where bx equal to three corresponds to a higher degree of compression than bx equal to two.

In addition, to enable a lossy data rate reduction, prominent peaks could be detected during the encoding and their position saved within an encoded data message.

The LIDAR receiver circuit 24 uses a multibit ADCs to achieve sufficient SNR. The amount of data generated depends on the ADC bitwidth (bw) (i.e., ADC resolution) and the number N of readout channels. The acquired ADC data may be stored/buffered on-chip at the receiver circuit 24 as the acquisition rate is likely much higher than a transmission interface maximum bandwidth, where the transmission interface may be, for example, low-voltage differential signaling (LVDS) to A2G.

It is noted that two techniques, averaging and thresholding, may be used for generating of LIDAR data and for the compression. Averaging helps to achieve better SNR and enables better utilization of the interface's bandwidth. Here, the number of minimum required averaging cycles directly affect the frame rate. Thresholding may be used for lossy data rate reduction and may help to reduce the traffic between the receiver circuit 24 and the system controller 23. Specifically, the thresholding may be used to detect peaks that are above a certain peak threshold for determining whether to compress an ADC sample or not. For example, as will be discussed below, delta values are calculated and stored in data units of a data packet. The thresholding may be used to determine whether a full bitwidth of the delta value is stored as a data unit or a reduced bitwidth of the delta value is stored as the data unit. A reduced bitwidth of the delta value may include only the least significant bits (LSBs) of the full delta value where at least one most significant bit (MSB) is not included in the stored delta value.

Figure 3A:
FIG. 3A shows an example of a raw data packet stored in a transmission buffer of a receiver circuit after analog-to-digital conversion according to one or more embodiments.

FIG. 3A shows an example of a raw data packet 300 stored in a transmission buffer of a receiver circuit after ADC conversion according to one or more embodiments. The data packet 300, as shown, is a data payload that includes N data units, where each data unit is representative of an ADC sample of a corresponding readout channel. A "readout channel" may generally refer to a data channel that includes an analog readout channel, an ADC, and a digital readout channel. In other words, during a single data acquisition, each analog readout channel is coupled to one or more pixels of the photodetector array 15 from which LIDAR data is sampled. Data from each analog readout channel is converted to its own ADC sample that makes up a single data unit of the data packet 300. The samples from N readout channels are then sequentially arranged to form the data packet 300.

For example, in the case N=32, there are 32 readout channels with corresponding ADCs. During an image acquisition taken at an acquisition time, each ADC generates an ADC sample that is stored as a data unit in the transmission buffer, resulting in 32 original data samples/units x0-x(N−1) (e.g., x0-x31). Each original data unit x0-x(N−1) is a raw data sample having a bitwidth (bw) equal to the ADC bitwidth (i.e., the ADC resolution). In this example, the ADC bitwidth is equal to six, but is not limited thereto. Thus, for a data packet is generated for an image acquisition that includes a data unit for each readout channel. In this example, an original data packet length $L_{orig}$ is determined by equation (1), where N is the number of ADC samples and bw is the ADC resolution.

$$L_{orig} = N \cdot bw \quad (1)$$

Therefore, in this example, the original data packet length is equal to 192 bits.

Figure 3B:
FIG. 3B shows an example of a compressed data packet stored in a transmission buffer of a receiver circuit after analog-to-digital conversion according to one or more embodiments.

FIG. 3B shows an example of a compressed data packet 301 stored in a transmission buffer of a receiver circuit after ADC conversion according to one or more embodiments. The data packet 301, as shown, is a data payload that includes N data units, where each data unit is representative of an ADC sample of a corresponding readout channel.

In particular, during compression, the difference between adjacent samples is computed and the delta value "ri" is stored, thus reducing the amount of transferred data by N−1 bits, where N is the number of ADC samples. The initial data unit r0 of the compressed data packet is equivalent to the uncompressed, first original data unit x0 (i.e., r0=x0) and serves as a basis for the delta data units r1-r(N−1). As a result, the bitwidth of data unit r0 is a full sample that is equal to the bitwidth of x0 (i.e, bw). In contrast, the further delta data units have a reduced bitwidth of bw1 due to the reduction of data needed to store delta values. For example, if bw is equal to 6 bits, bw1 may be equal to 5 bits. As a result, the compressed data packet 301 may have a reduced packet length of 32*5+1=161. It is further noted that the original data x0-x(N−1) and the initial data unit r0 are unsigned values, whereas all delta data units r1-r(N−1) are signed values.

Figure 4:
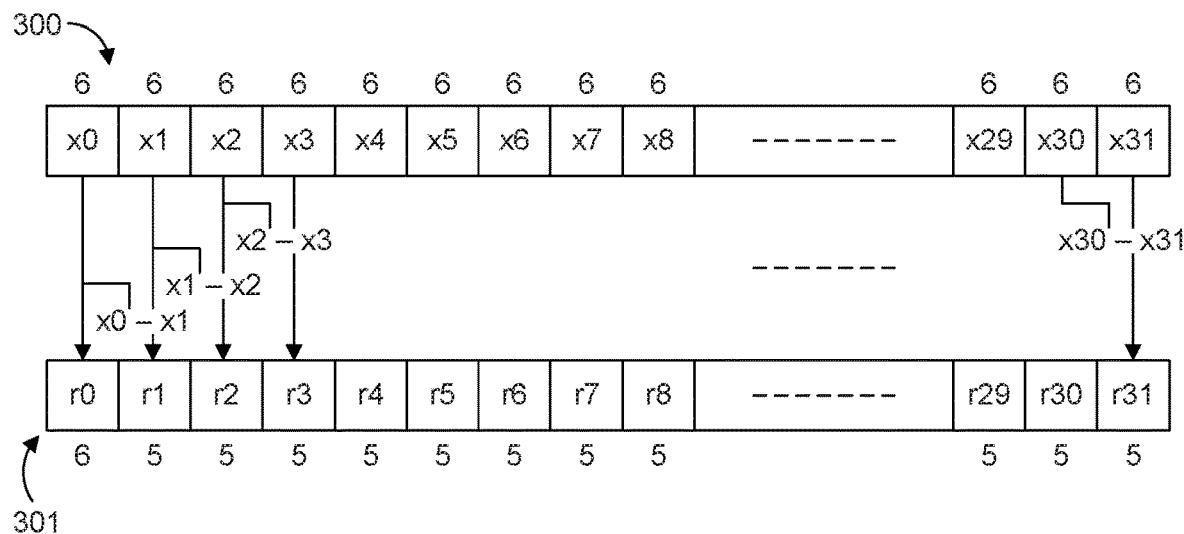
FIG. 4 illustrates a method of generating the compressed data packet shown in FIG. 3B.

FIG. 4 illustrates a method of generating the compressed data packet 301 shown in FIG. 3B.

Figure 3C:
FIG. 3C shows an example of a compressed data packet stored in a transmission buffer of a receiver circuit after analog-to-digital conversion according to one or more embodiments.

FIG. 3C shows an example of a compressed data packet 302 stored in a transmission buffer of a receiver circuit after ADC conversion according to one or more embodiments. The data packet 302, as shown, includes a packet header 303 and a data payload 304. Similar to the previous example, the data payload 304 includes N data units, where each data unit is representative of an ADC sample of a corresponding readout channel. The data packet 302 is generated as a result of a delta overshoot determination that determines whether a delta value can be encoded with a reduced number of bits (e.g., bw1) (i.e. as a reduced delta value) or whether the delta value should be stored as a full delta value that is equivalent to the full bitwidth (i.e., bw) of the original data.

For example, the full delta value (i.e., a full bitwidth of the delta value) may be represented by 6 bits equal to the ADC bitwidth bw. In contrast, a reduced delta value (i.e., a reduced bitwidth of the delta value) is generated by reducing the full delta value to the reduced bitwidth bw1, which may be either 5 bits or 4 bits in this example depending on the set compression mode. The full delta value is reduced by selecting the LSBs according to the reduced bitwidth bw1. Thus, 5 or 4 LSBs are used for the reduced delta value, again depending on the set compression mode.

For example, a delta overshoot is detected in the case that a delta value cannot be encoded with a reduced number of bits. In this case, a position of the data unit which contains the delta overshoot is stored in the packet header 303, in a pointer field, and the full delta value is stored at the respective delta data unit in the payload 304. Thus, the delta data units r1-r(N−1) may include a mix of data units having two different bitwidths, including a full bitwidth bw and a reduced bitwidth bw1. In addition, the packet header 303 includes a delta overshoot counter field that stores the number of detected overshoots K that occur during the encoding/compression procedure that is performed on the sequence of ADC data samples output by the ADCs.

The final data packet 302 includes the number of overshoots (K), overshoot positions (P array) each corresponding to one of the delta data units r1-r(N−1) at which an overshoot was detected (e.g., P=2, when an overshoot is detected at r2), an initial data unit r0, and delta data units r1-r(N−1) (i.e., an r array of data units).

The length $L_{comp}$ of this data packet 302 is computed by equation (2), where m is the number of bits used to store overshoots, K is the number of occurred overshoots, $\log_2(N)$ is the bitwidth of each pointer value, N is the number of ADC samples, bw is the full ADC resolution, bw1 is the reduced bitwidth (e.g., bw-1 or bw-2), and bx is the compression ratio value (e.g., 2 or 3).

$$L_{comp} = m + K \cdot \log_2(N) + N \cdot (bw - bx + 1) + K + 1 \quad (2)$$

It is noted that the reduced bitwidth bw1=bw−bx+1. Thus, if bw is six and bx is two, bw1 is equal to five. On the other hand, bw1 is equal to four when bx is three. Thus, the compression rate is proportional to bx.

Thus, the compression ratio $R_{comp}$ is computed by equation (3).

$$R_{comp} = \left(1 - \frac{L_{comp}}{L_{orig}}\right) \cdot 100\% \quad (3)$$

It is further noted that a delta overshoot is detected when the difference (delta) between two adjacent data samples is greater than an overshoot threshold defined by 2 to the power of bw minus bx (i.e., $2^{(bw-bx)}$). As a result, a comparator and a counter are introduced to properly handle the peak values of a data sample that results in the delta overshoot.

Figure 3D:
FIG. 3D shows an example of a final compressed data packet stored in a transmission buffer of a receiver circuit after analog-to-digital conversion according to one or more embodiments.

FIG. 3D shows an example of a final compressed data packet 305 stored in a transmission buffer of a receiver circuit after ADC conversion according to one or more embodiments. In this example, the compression ratio value bx is two and three overshoots at delta data units r2, r7, and r31 are detected. As a result of the compression ratio value bx being set at two, the reduced bitwidth is equal to bw-1 such that one additional bit is needed to store each overshoot (i.e., m=3). On the other hand, if bx was set to three, two additional bits would be needed to store each overshoot (i.e., m=6).

As will be described, the decompression works in the reverse manner. It takes as an input the number of overshoots (K) detected during compression and their positions (P array), and calculates the difference between adjacent samples, resulting in a reconstructed ADC sample sequence.

FIGS. 5A-5F illustrate a method of generating the compressed data packet 302 shown in FIG. 3C. Specifically, FIGS. 5A-5F illustrate a method of generating the compressed data packet 305 shown in FIG. 3D, which serves merely as an example of one possible result of the compression method.

Figure 5A:
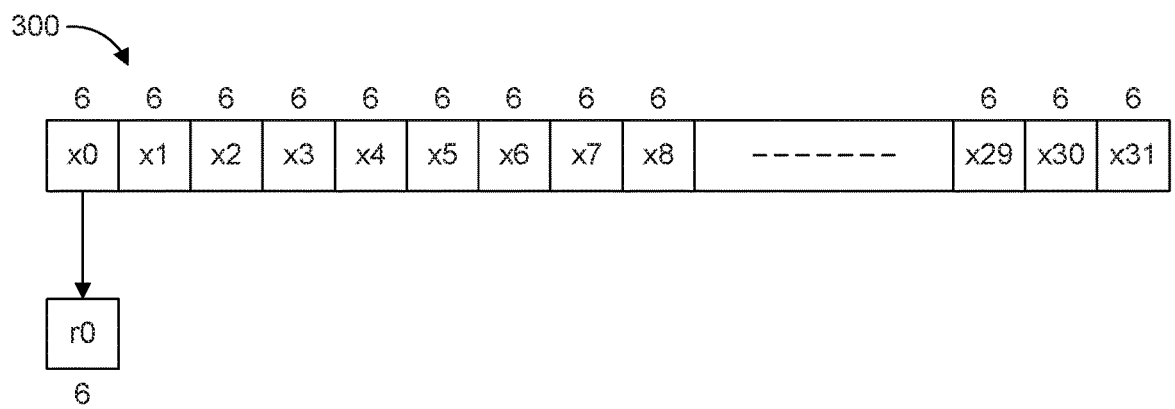
FIGS. 5A-5F illustrate a method of generating the compressed data packet shown in FIG. 3D.

In FIG. 5A, the compression method starts by storing the initial original data sample x0 of the data packet 300 as the value for the initial data unit r0.

Figure 5B:
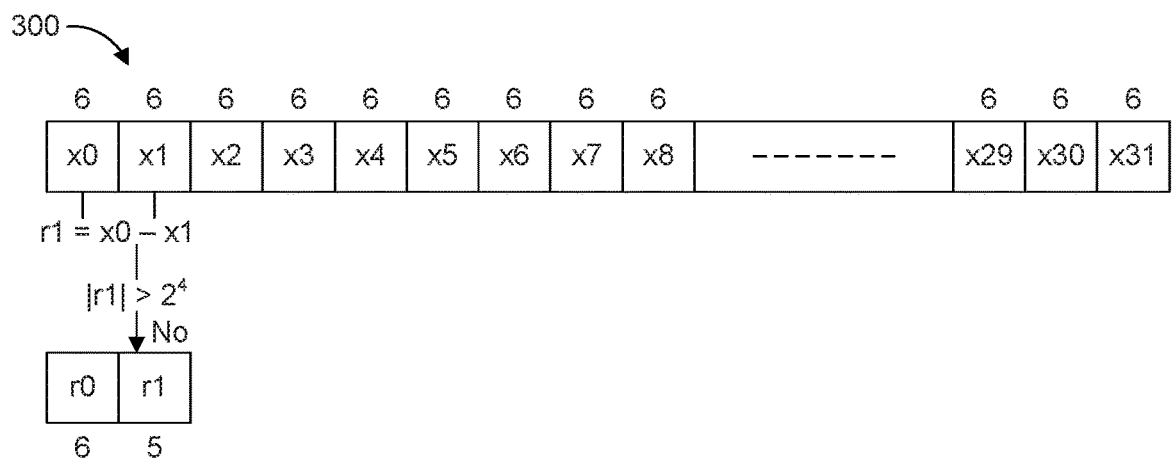

In FIG. 5B, the delta between ADC sample values for original data units x0 and x1 is calculated for delta data unit r1. However, prior to storing the delta value, the absolute value of the delta value is compared to the overshoot threshold $2^{(bw-bx)}$, where bw=6 and bx=2. If the absolute value of the delta value is not greater than the overshoot threshold, as is the case here, the delta value is stored in the delta data unit r1 with a reduced bitwidth of bw1. In other words, the delta value is stored as a reduced delta value.

Figure 5C:
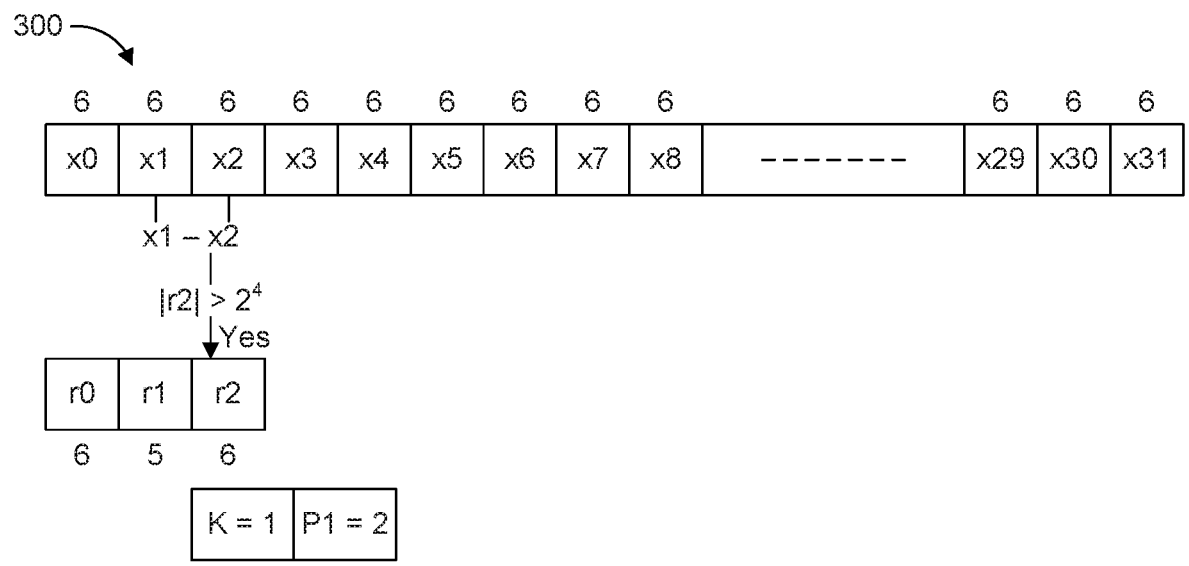

In FIG. 5C, the delta between ADC sample values for original data units x1 and x2 is calculated for delta data unit r2. However, prior to storing the delta value, the absolute value of the delta value is compared to the overshoot threshold $2^{(bw-bx)}$, where bw=6 and bx=2. If the absolute value of the delta value is greater than the overshoot threshold, as is the case here, the full delta value is stored in the delta data unit r2 with the full bitwidth bw.

In addition, the overshoot counter K is incremented by 1 (e.g., from 0 to 1) and a pointer P1 is generated that points to the delta data unit at which the delta overshoot was detected (e.g., r2). That is, the pointer P1 stores the value "2" corresponding to delta data unit r2 that stores a full delta value. At this point, K indicates there is one delta data units that stores a full delta value and a pointer P1 exists to indicate which delta data unit stores the full delta value (i.e., a non-reduced bitwidth).

Figure 5D:
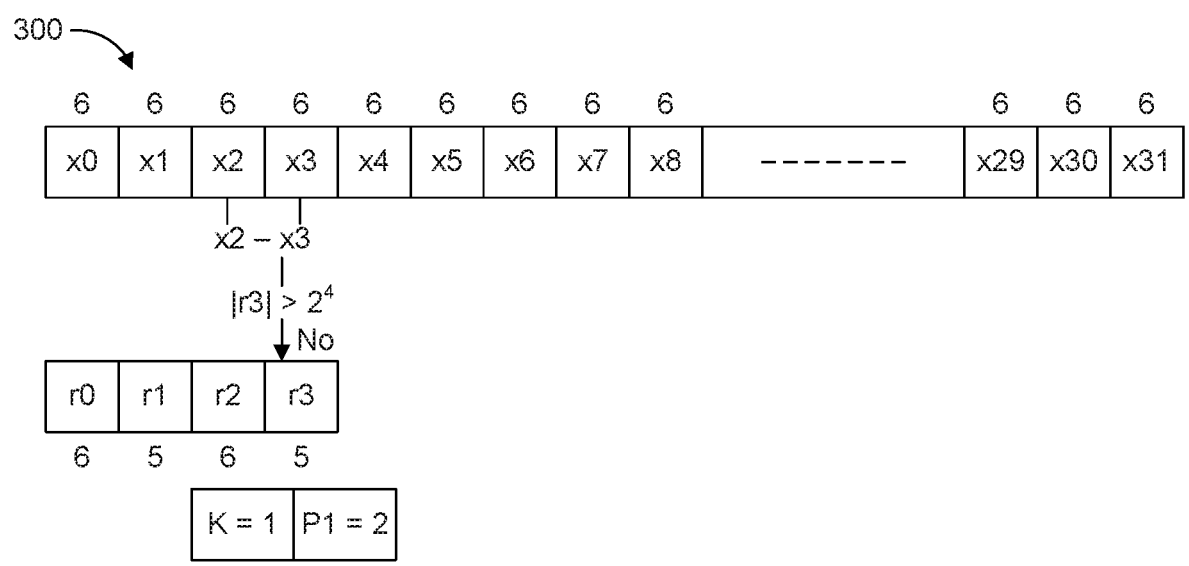

In FIG. 5D, the delta between ADC sample values for original data units x2 and x3 is calculated for delta data unit r3. However, prior to storing the delta value, the absolute value of the delta value is compared to the overshoot threshold $2^{(bw-bx)}$, where bw=6 and bx=2. If the absolute value of the delta value is not greater than the overshoot threshold, as is the case here, the delta value is stored in the delta data unit r3 with a reduced bitwidth of bw1. It will be appreciated that the overshoot counter remains unchanged at 1 and no additional pointer is generated since no delta overshoot is detected.

Figure 5E:
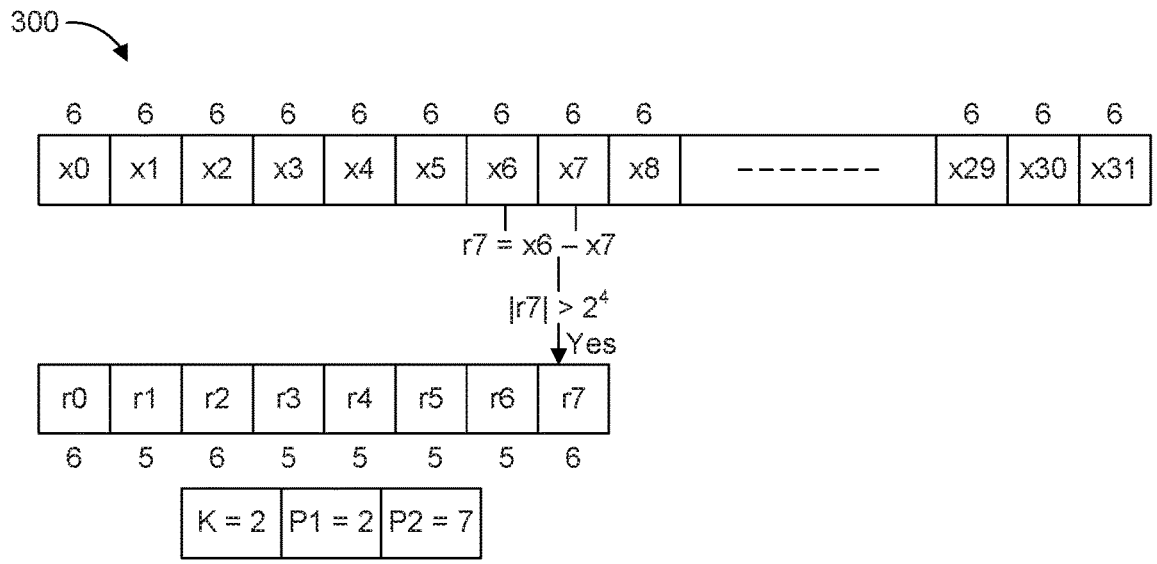

In FIG. 5E, the delta between ADC sample values for original data units x6 and x7 is calculated for delta data unit r7. This occurs after delta data units r5 and r6 have been determined. Prior to storing the delta value, the absolute value of the delta value is compared to the overshoot threshold $2^{(bw-bx)}$, where bw=6 and bx=2. If the absolute value of the delta value is greater than the overshoot threshold, as is the case here, the full delta value is stored in the delta data unit r7 with the full bitwidth bw.

In addition, the overshoot counter K is incremented by 1 (e.g., from 1 to 2) and a pointer P2 is generated that points to the delta data unit at which the delta overshoot was detected (e.g., r7). That is, the pointer P2 stores the value "7" corresponding to delta data unit r7 that stores a full delta value. At this point, K indicates there are two delta data units that store a full delta value and a pointer P2 exists to indicate which additional delta data unit stores a full delta value (i.e., a non-reduced bitwidth).

Figure 5F:
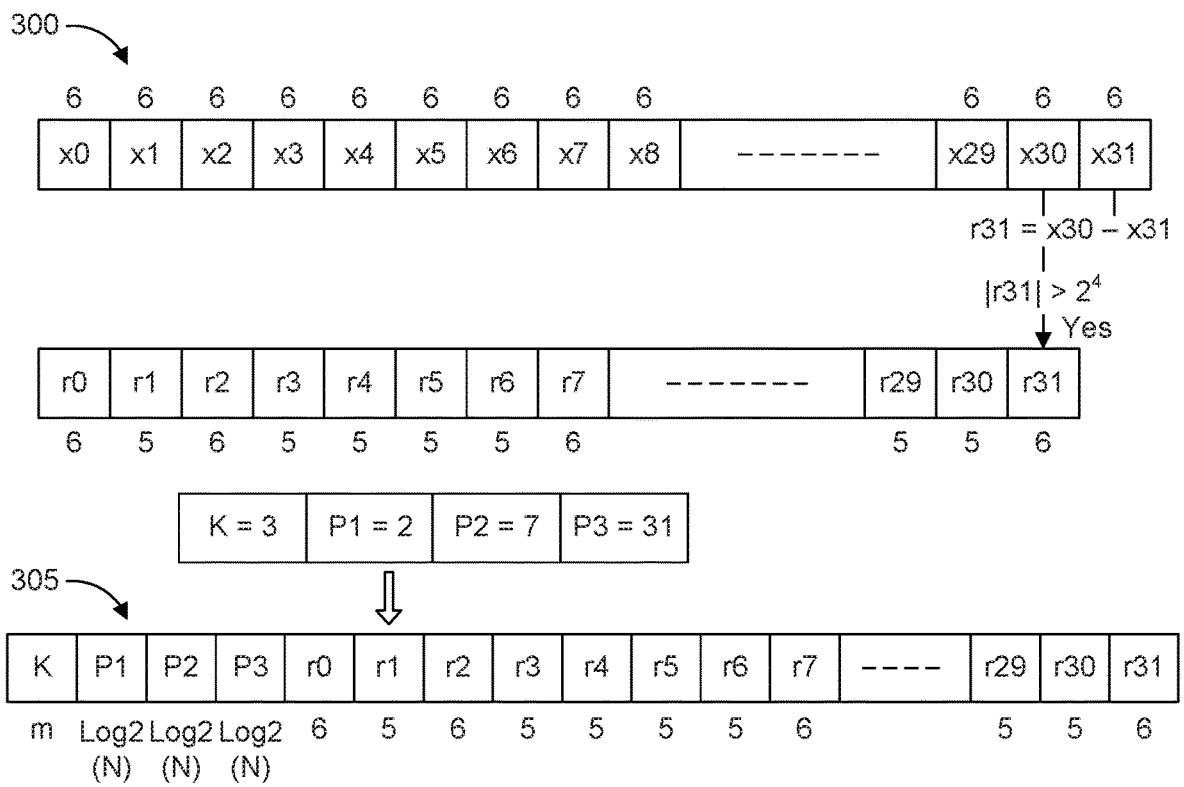

In FIG. 5F, the delta between ADC sample values for original data units x30 and x31 is calculated for delta data unit r31. This occurs after the remaining delta data units r8-r30 have been determined, during which no addition delta overshoots have been detected. Prior to storing the delta value, the absolute value of the delta value is compared to the overshoot threshold $2^{(bw-bx)}$, where bw=6 and bx=2. If the absolute value of the delta value is greater than the overshoot threshold, as is the case here, the full delta value is stored in the delta data unit r31 with the full bitwidth bw.

In addition, the overshoot counter K is incremented by 1 (e.g., from 2 to 3) and a pointer P3 is generated that points to the delta data unit at which the delta overshoot was detected (e.g., r31). That is, the pointer P3 stores the value "31" corresponding to delta data unit r31 that stores a full delta value. At this point, K indicates there are three delta data units that store a full delta value and a pointer P3 exists to indicate which additional delta data unit stores a full delta value (i.e., a non-reduced bitwidth).

Figure 6:
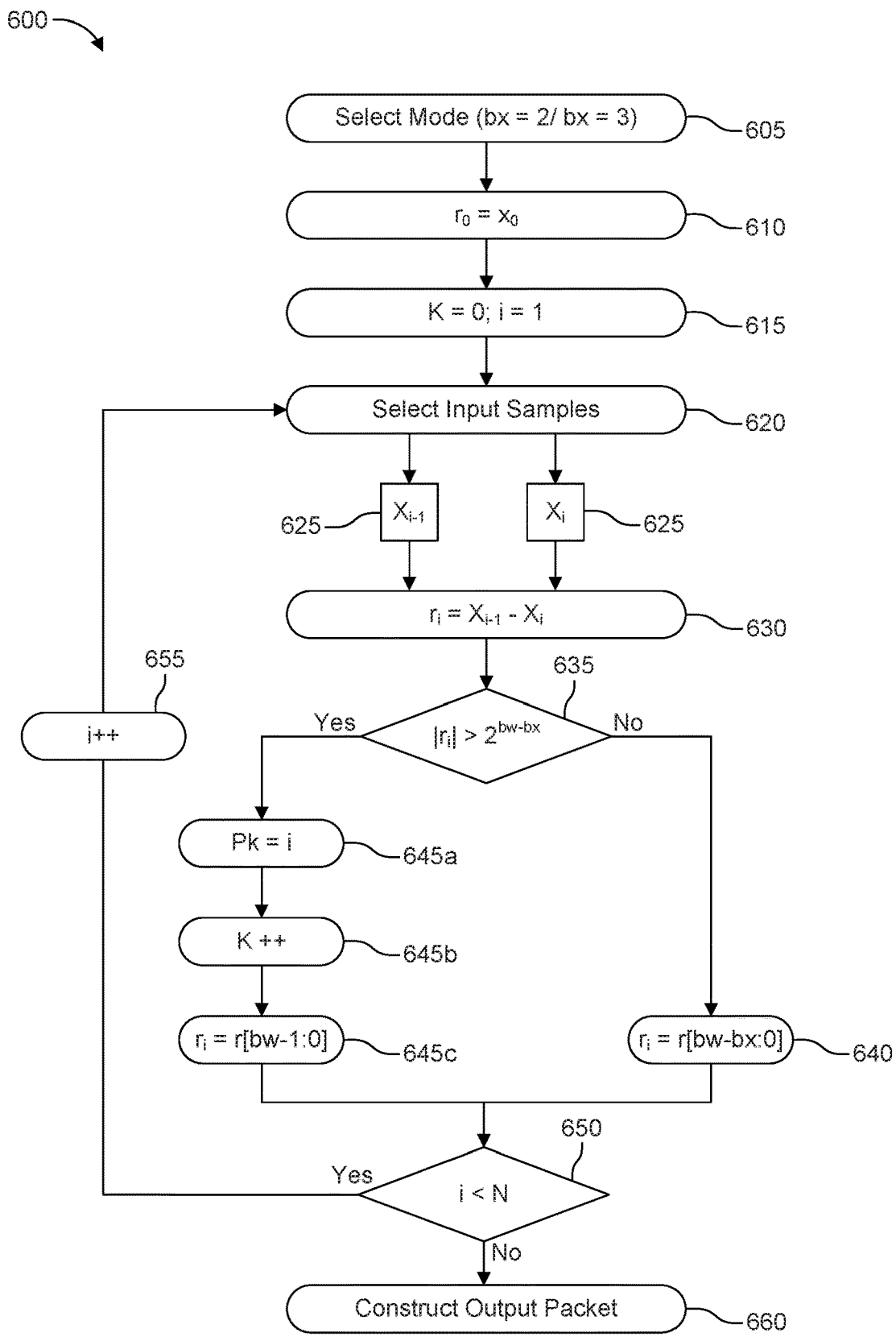
FIG. 6 illustrates a flow diagram of a LIDAR data compression method implemented by an encoder according to one or more embodiments.

FIG. 6 illustrates a flow diagram of a LIDAR data compression method 600 implemented by an encoder according to one or more embodiments. In the flow diagram, m is the number of bits for storing K value; i is the loop counter; k is the overshoot position counter; K is the number of overshoots in the din packet (i.e., in the compressed packet) and located at bits [m−1:0]; P[K:1] represents an array of K overshoot position pointers, each overshoot position pointer has a bitwidth of log 2(N) and each overshoot position pointer points to a full bitwidth delta data unit; Pk is the pointer position of a full delta data unit corresponding to the overshoot position counter k, N is the number of ADC samples The LIDAR data compression method 600 includes selecting the compression mode by setting the compression ratio variable bx to either 2 or 3 (operation 605), storing the initial original sample value x0 as the initial data unit r0 (operation 610), and initializing the overshoot counter K to zero (i.e., K=0) and i to 1 (i.e., i=1) (operation 615). The initial original sample value x0 may a stored ADC sample corresponding to a first readout channel.

The LIDAR data compression method 600 further includes selecting the input ADC samples from an original data packet or taken from stored values of the appropriate readout channels (operation 620) and storing the selected values in a buffer (operation 625). Here, "i" corresponds to the delta data unit ri being addressed. Thus, if the delta data unit r1 is being determined, i=1, $x_{i-1}$=x0, and $x_1$=x1.

In operation 630, the sample value of $x_i$ is subtracted from $x_{i-1}$ (i.e., ri=$x_{i-1}$−$x_i$) to determine the delta sample value ri. This operation may be performed by an arithmetic logic unit (ALU), for example. The absolute value of the delta sample value ri is then compared, using a comparator, to the delta overshoot threshold $2^{(bw-bx)}$ to determine the size of the stored delta value (operation 635).

If the absolute value of the delta sample value ri is equal to or less than the delta overshoot threshold, the length of the delta data unit is set to r[bw-bx:0] (operation 640). For example, if bw is 6 and bx is 2 (i.e., bw-bx is 4), [bw-2:0] results in bw-1 bits.

On the other hand, if the absolute value of the delta sample value ri is greater than the delta overshoot threshold, the pointer Pk is set to i in operation 645a, the overshoot counter K is incremented by one in operation 645b, and the length of the delta data unit is set to r[bw-1:0] in operation 645c. In this case, the length of the delta data unit is equal to the full ADC bitwidth bw.

In operation 650, the value i is compared to the number of readout channels N. If the value i is less than N, the value i is incremented by one in operation 655 and the procedure returns to operation 620 to select new ADC sample values based on the new value of i. On the other hand, if the value i is not less than N (i.e., is equal to N), all delta data units have been determined and the method proceeds to operation 660 for constructing the compressed output packet, including generating the appropriate packet header, for transmission to the system controller 23.

Figure 7:
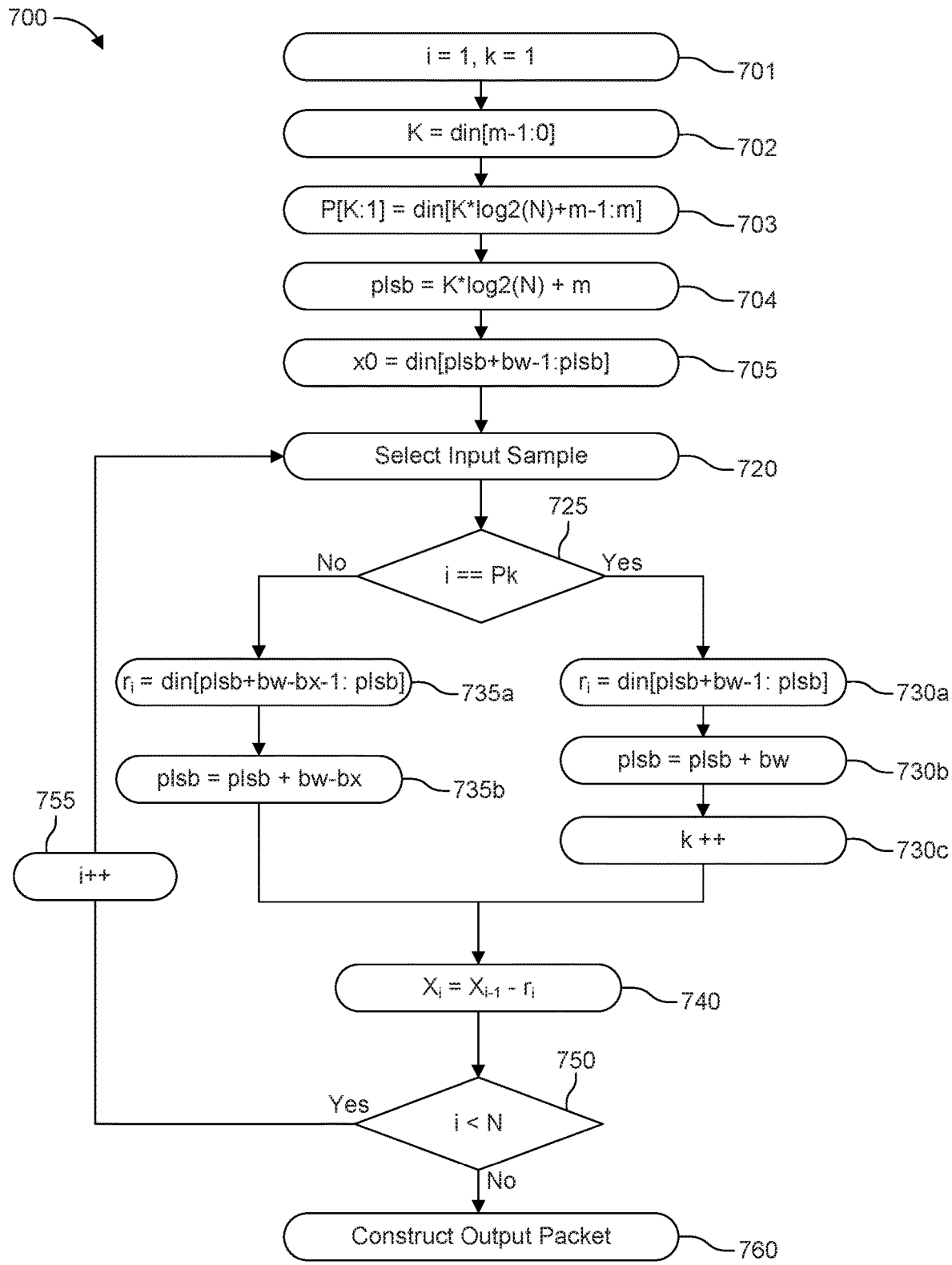
FIG. 7 illustrates a flow diagram of a LIDAR data decompression method implemented by a decoder according to one or more embodiments.

FIG. 7 illustrates a flow diagram of a LIDAR data decompression method 700 implemented by a decoder according to one or more embodiments. The decompression works in the reverse manner. It takes as an input the number of overshoots (K) detected during compression and their positions (P array), and calculates the difference between adjacent samples, resulting in a reconstructed ADC sample sequence. In the flow diagram, m is the number of bits for storing K value; i is the loop counter; k is the overshoot position counter; K is the number of overshoots in the din packet (i.e., in the compressed packet) and located at bits [m−1:0]; P[K:1] represents an array of K overshoot position pointers, each overshoot position pointer has a bitwidth of log 2(N) and each overshoot position pointer points to a full bitwidth delta data unit; Pk is the pointer position of a full delta data unit corresponding to the overshoot position counter k, N is the number of ADC samples; and plsb is the pointer to the LSB bit (i.e., the LSB position) of the ri delta value.

In the example case: P[K:1]=din[K*log 2(N)+m−1:m], m=3, K=3, N=32. As such, P[3:1]=din[3*log 2(32)+3−1:3]. Thus, there are three overshoot position pointers (P3, P2, P1) with 5 bits each.

Operations 701-705 represent initialization steps during which certain values are initialized and/or reset for decoding a compressed packet.

In operation 701, the loop counter i and the overshoot position counter k are initialized to 1.

In operation 702, the decoder (see e.g., decoder 86 in FIG. 8) determines the number of overshoots that are received within the compressed packet din and assigns K the number of determined overshoots. This data is located at the bits din[m−1:0].

In operation 703, the decoder analyzes the positions of full delta values that are located in din[K*log 2(N)+m−1:m]. As a result, there is an array with K numbers and the decoder determines positions of the full delta data units that store a full bw bits.

In operation 704, the decoder stores a position of the first data unit r0 in LSB pointer plsb=K*log 2(N)+m. In other words, the decoder determines where encoded delta r-array starts and stores the starting position of the delta r-array in the LSB pointer plsb.

In operation 705, the decoder extracts the initial original sample value x0 from the initial data unit r0 of the compressed data packet din[plsb+bw−1:plsb]. As noted above, the initial data unit r0 is the same as the first ADC sample x0.

In operation 720, an input sample (i.e., a delta data unit) of the compressed data packet is selected. For example, the loop counter value i may be initialized to 1 in operation 701 since x0 corresponding to r0 is already known. In other words, delta data unit r1 is initially selected.

In operation 725, the loop counter value i is compared to the pointer position of the delta data unit corresponding to the overshoot position counter k. For example, initially, the value i is compared to the pointer position of the delta data unit corresponding to the first overshoot P1. In the examples shown in FIGS. 3D and 5F, the pointer position of the first overshoot P1 is 2. Thus, in this example, the value i will be initially compared to 2 until the overshoot position counter k is incremented in operation 730.

If the loop counter value i is determined to match the pointer value, the method proceeds to process branch 730, including operations 730a-730c. In operation 730a, the decoder extracts the bits from the compressed packet for the data decompression corresponding to the delta data unit ri=din[plsb+bw−bx: plsb], which represents the location of the bits of the delta data unit ri within the compressed data packet.

In addition, in operation 730b, the pointer plsb is incremented by bw (i.e., plsb=plsb+bw) in order to point to the LSB of the next delta data unit.

In operation 730c, the overshoot position counter k is incremented by one such that Pk (e.g., P2, P3, etc.) corresponds to the position of next full delta data unit in the compressed data packet. For example, if Pk is incremented to P2, the position of next full delta data unit is 7 according to the example shown in FIGS. 3D and 5F. As a result, loop counter value i in operation 725 will subsequently be compared to 7.

In operation 725, if the loop counter value i is determined not to match the pointer position of the delta data unit corresponding to the overshoot position counter k, the method proceeds to process branch 735, including operations 735a and 735b. In operation 735a, the decoder extracts the bits from the compressed packet for the data decompression corresponding to the delta data unit ri=din[plsb+bw−bx−1: plsb], which represents the location of the bits of the delta data unit ri within the compressed data packet. In operation 735b, the pointer plsb is incremented by bw−bx (i.e., plsb=plsb+bw−bx) in order to point to the LSB of the next delta data unit.

Subsequent to either process branch 730 or 735, the method 700 proceeds to operation 740, during which the ADC sample value xi is determined as xi=$x_{1-1}$−ri.

In operation 750, the value i is compared to the number of readout channels N. If the value i is less than N, the loop counter value i is incremented by one in operation 755 and the procedure returns to operation 720 to select new input sample value ri based on the new loop counter value of i. On the other hand, if the value i is not less than N (i.e., is equal to N), all data units have been determined/decoded and the method proceeds to operation 760 for constructing the decompressed output packet which can be used by the system controller 23 for generating point cloud data, etc.

Figure 8:
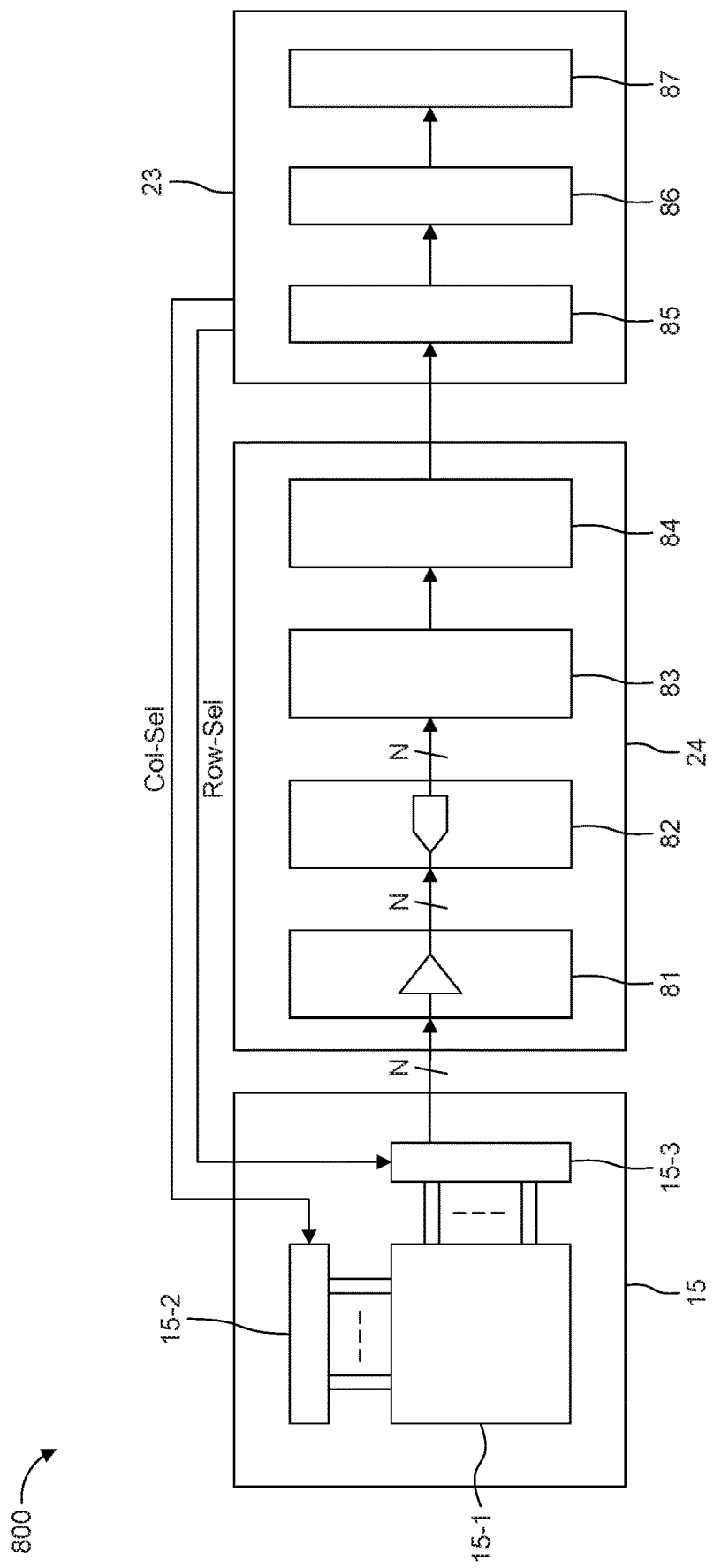
FIG. 8 is a schematic block diagram of an electrical signal path of a LIDAR system in accordance with one or more embodiments.

FIG. 8 is a schematic block diagram of an electrical signal path of a LIDAR system 800 in accordance with one or more embodiments. In particular, the electrical signal path of a LIDAR system 800 includes a photodetector circuit 15, a receiver circuit 24, and a system controller 23.

The photodetector circuit 15 includes a 2D photodetector array 15-1, a decoder 15-2, and an analog multiplexer (mux) 15-3. In this example, the photodetector array is a 2D photodetector array with 96 columns and 128 rows but is not limited thereto. For instance, the 2D photodetector array may have 32 rows, each corresponding to a different readout channel. A particular column may be enabled when it is receiving light (i.e., synchronized according to a firing direction of the laser by the transmitter). This helps to reduce noise of ambient light. The decoder 31-2 receives a column select information Col_Sel from the system controller 23 indicating which column or columns to enable, and the decoder 31-2 enables the corresponding column or columns.

The analog multiplexer 31-3 is configured to receive and route analog signals and is further configured to select which rows from the photodetector array 15-1 to output from the photodetector circuit 15. That is, the analog multiplexer includes a number N of readout channels (e.g., 32 readout channels) that may be fewer than the number of rows of the photodetector array 15-1. The analog multiplexer 15-3 receives row select information Row_Sel from the system controller 23 indicating which row or rows to route to a particular readout channel, and the analog multiplexer 15-3 routes the corresponding row or rows accordingly. The analog multiplexer 15-3 includes readout elements, coupled to the readout channels, that selectively read out or output an analog signal received from one or more adjacent rows of the photodetector array 15-1 to the next stage of the receiver signal path. In this way, each photodetector pixel of the photodetector array 15-1 can be individually selected by column (via the decoder) and by row (via the analog multiplexer) for output to one of the readout channels.

When multiple adjacent rows are routed to a single readout channel, the signals of those rows are summed together by the readout elements of the analog multiplexer 15-3 by, for example, averaging, and the combined signal is read out by the analog multiplexer at the appropriate channel.

The receiver circuit 24 includes an array of amplifiers 81, an array of multibit ADCs 82, an encoder 83, and a communication interface 84 that is coupled to the system controller 23.

The array of amplifiers 81 includes an amplifier for each readout channel. The amplifiers may be TIAs configured to convert the current analog signals of a corresponding channel received from the photodetector circuit 15 into voltage signals. Thus, each channel includes a TIA that performs this conversion. Each TIA may further amplify and filter the electrical signal. Each voltage signal is then routed along a corresponding channel to the array of multibit ADCs 82.

The array of multibit ADCs 82 includes a multibit ADC for each readout channel that is configured to detect the analog voltage signals output from the array of amplifiers 81 for ToF measurements, as well as to digitize the analog voltage signals. The array of multibit ADCs 82 provides these processed signals to the encoder 83 that is configured to compress the sequence of ADC samples received from the N readout channels and construct a compressed data packet for transmission. The communication interface 84 receives the compressed data packet and transmits the compressed data packet to the system controller 23.

It will be appreciated that the receiver circuit 24, and particularly the receiver signal path, is not limited to the elements shown and that additional elements may be present. For example, additional signal processing circuitry (e.g., a filtering stage or an averaging stage) may be introduced between ADCs 82 and the encoder 83. Regardless of any intervening signal processing circuitry between ADCs 82 and the encoder 83, the sequence of ADC samples are received by the encoder in some form (e.g., as original ADC samples or as processed ADC samples). Thus, these samples are generally referred to as ADC samples regardless of form.

The system controller 23 includes a communication interface 85, a decoder 86, and a DSP 87. The communication interface 85 is configured to receive the compressed data packet and provide the compressed data packet to the decoder 86. The decoder 86 is configured to reconstruct the original sequence of ADC samples from the compressed data packet. In other words, decoder 86 decompresses the compressed data packet to obtain the original N ADC samples. The decoder 86 then provides the ADC samples to the DSP 87 for further data processing (e.g., for generating 3D point cloud data).

Both the encoder 83 and the decoder 86 includes data buffers, logic (e.g., arithmetic logic units (ALUs)), comparators, and counters for implementing the algorithms described in FIGS. 6 and 7, respectively.

Figure 9:
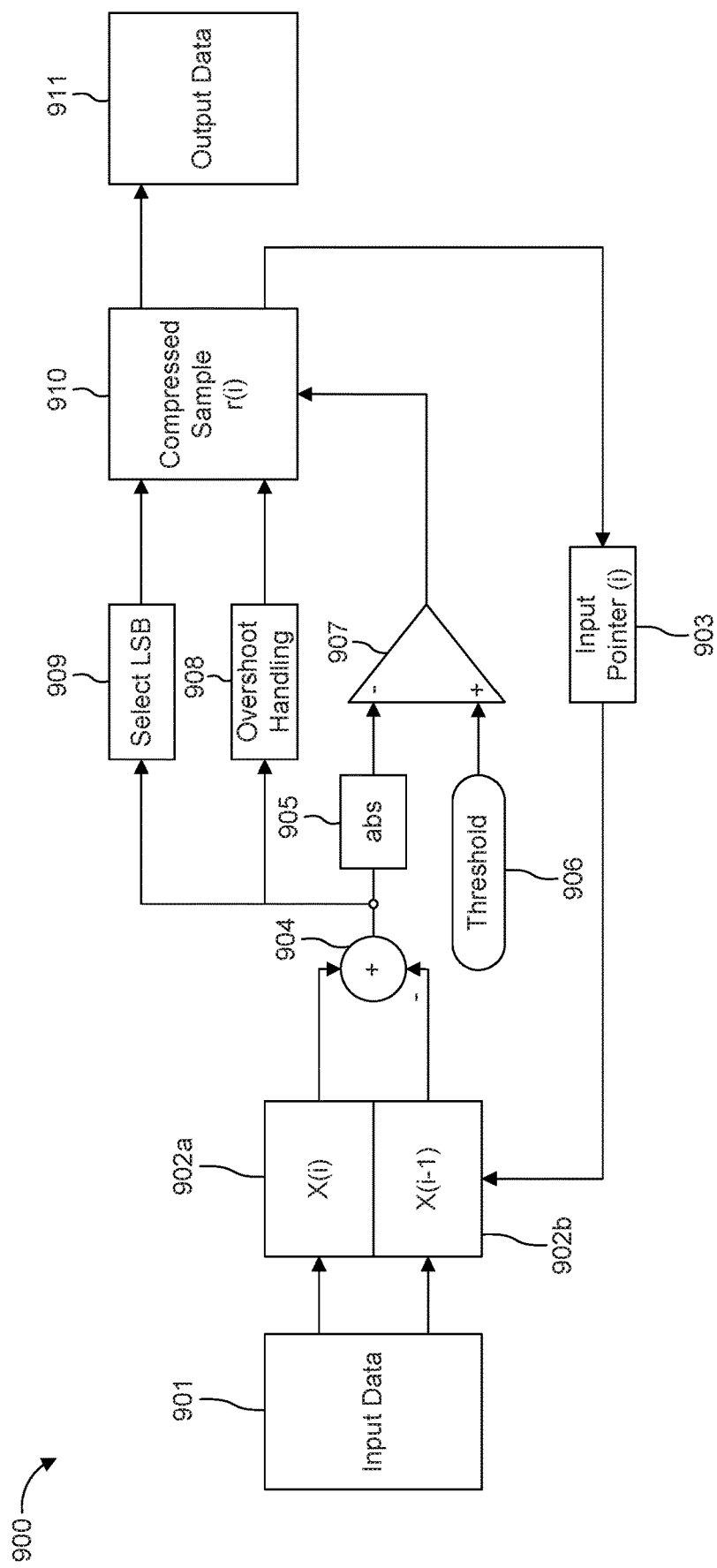
FIG. 9 is a schematic block diagram of an encoder of a LIDAR system in accordance with one or more embodiments.

FIG. 9 is a schematic block diagram of an encoder 900 of a LIDAR system in accordance with one or more embodiments. In particular, the encoder 900 shows a portion of the circuity used to generate a delta value and may be implemented as part of the encoder 83 in FIG. 8. The encoder 900 includes a memory 901 that stores the sequence of ADC samples, and data buffers 902a and 902b that each selectively store one of the ADC samples based on input pointer (i) 903. The encoder 904 further includes an ALU that subtracts the ADC sample $x(i-1)$ from ADC sample $x(i)$ to generate a full delta value. An absolute value unit 905 receives the full delta value, which may be a positive or negative value, and generates an absolute value of the full delta value. A comparator 907 compares the absolute value of the full delta value to an overshoot threshold value 906, and the output of the comparator 907 indicates whether or not the absolute value of the full delta value is greater than the overshoot threshold value.

The encoder 900 further includes an overshoot handling data buffer 908 that stores the full delta value output from the ALU 904, and a LSB data buffer 909 that selects the LSBs of the full delta value according to the reduced bitwidth bw1 and stores the reduced delta value. A processor 910 receives the comparison result from the comparator 907 and selects either the delta value stored in data buffer 908 or data buffer 909 depending on the comparison result. The selected delta value is used as the delta value for data unit $r(i)$, and is output as output data 911. The processor 910 is further configured to increment the input pointer (i) 903 in order for the next delta value to be calculated for the next data unit $r(i)$.

In view of the above, the proposed concept is optimized for performance and throughput and brings the following improvements: compresses the LiDAR raw data by up to 33-34%, which could enable the full-waveform transfer between the sensor receiver and the system controller; uses counters, subtraction ALUs, and comparator operators to compress the data; a lossless compression ratio (~16%) is independent from SNR when used in combination with a matched filter and/or averaging circuit; can be implemented in both software and hardware, which increases the versatility of the algorithm, and can be used for optimizing the use of the on-chip memory by compressing the data for the temporary storing.

Thus, the compression and decompression algorithms described above that are able to compress/decompress the raw LIDAR data may be implemented as an equivalent digital circuit, which may further be used in combination with part of software implemented on a processor that performs one or more arithmetic functions.

Although embodiments described herein relate to compressing LIDAR data, it is to be understood that other implementations may include other types of data and the concepts described herein may be extended to other types of data systems.

In addition, although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer, or an electronic circuit. In some embodiments, some one or more of the method steps may be executed by such an apparatus.

Depending on certain implementation requirements, embodiments provided herein can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein refers to any of the foregoing structures or any other structure suitable for implementation of the techniques described herein. In addition, in some aspects, the functionality described herein may be provided within dedicated hardware and/or software modules. Also, the techniques could be fully implemented in one or more circuits or logic elements.

The above described exemplary embodiments are merely illustrative. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A Light Detection and Ranging (LIDAR) system, comprising:
   a LIDAR receiver comprising:
      a photodetector array configured to generate a plurality of electrical signals based on receiving a reflected light beam;
      a receiver circuit including a plurality of readout channels configured to read out the plurality of electrical signals from the photodetector array and further including a plurality of multibit analog-to-digital converters (ADCs), wherein each of the plurality of readout channels includes a different one of the plurality of multibit ADCs, and each of the plurality of multibit ADCs is configured to convert at least one of the plurality of electrical signals into a multibit ADC data sample such that the plurality of multibit ADCs generate a sequence of multibit ADC data samples;
      an encoder coupled to the plurality of readout channels and configured to receive the sequence of multibit ADC data samples and generate a compressed data packet based on the sequence of multibit ADC data samples; and
      a communication interface configured to transmit the compressed data packet.

2. The LIDAR system of claim 1, wherein:
   the sequence of multibit ADC data samples includes an initial multibit ADC sample and a plurality of subsequent multibit ADC samples that are subsequent to the initial multibit ADC sample, and
   the compressed data packet comprises a plurality of data units including an initial data unit and a plurality of delta data units subsequent to the initial data unit, wherein the initial data unit stores the initial multibit ADC sample.

3. The LIDAR system of claim 2, wherein each of the plurality of delta data units stores a difference between two different adjacent multibit ADC samples of the sequence of multibit ADC data samples.

4. The LIDAR system of claim 3, wherein:
   the plurality of subsequent multibit ADC samples includes a first subsequent multibit ADC sample adjacent to the initial multibit ADC sample, and
   the plurality of delta data units include a first delta data unit adjacent to the initial data unit, and the encoder is configured to calculate a first delta value based on a difference between the first subsequent multibit ADC sample and the initial multibit ADC sample, and store the first delta value in the first delta data unit.

5. The LIDAR system of claim 4, wherein the encoder is configured to calculate first delta value by subtracting the first subsequent multibit ADC sample from the initial multibit ADC sample.

6. The LIDAR system of claim 4, wherein:
   the plurality of subsequent multibit ADC samples includes a second subsequent multibit ADC sample adjacent to the first subsequent multibit ADC sample, and the plurality of delta data units include a second delta data unit adjacent to the first delta data unit, and
   the encoder is configured to calculate a second delta value based on a difference between the first subsequent multibit ADC sample and the second subsequent multibit ADC sample, and store the second delta value in the second delta data unit.

7. The LIDAR system of claim 6, wherein the encoder is configured to calculate second delta value by subtracting the second subsequent multibit ADC sample from the first subsequent multibit ADC sample.

8. The LIDAR system of claim 2, wherein:
   the encoder includes a first counter that increments and stores a first counter value that corresponds to one of the plurality of subsequent multibit ADC samples and to one of the plurality of delta data units, and
   the encoder is configured to calculate a delta value for a delta data unit that corresponds to the first counter value by calculating a difference between a subsequent multibit ADC sample that corresponds to the first counter value and a multibit ADC sample of the sequence of multibit ADC data samples that precedes and is adjacent to the subsequent multibit ADC sample that corresponds to the first counter value.

9. The LIDAR system of claim 8, wherein the encoder includes a comparator configured to compare the delta value to a delta overshoot threshold,
wherein, on a condition that the delta value is greater than the delta overshoot threshold, the encoder is configured to store a full bitwidth of the delta value in the delta data unit that corresponds to the first counter value, and
wherein on a condition that the delta value is equal to or less than the delta overshoot threshold, the encoder is configured to store a reduced bitwidth of the delta value in the delta data unit that corresponds to the first counter value.

10. The LIDAR system of claim 9, wherein the overshoot threshold is based on a bitwidth of the plurality of multibit ADCs and a compression ratio variable.

11. The LIDAR system of claim 9, wherein the compressed data packet includes a packet header comprising an overshoot counter field,
wherein the encoder includes a second counter that increments and stores a second counter value that corresponds to a total number of detected delta overshoots,
wherein the encoder stores the second counter value in the overshoot counter field, and
wherein on the condition that the delta value is greater than the delta overshoot threshold, the encoder is configured to increment the second counter.

12. The LIDAR system of claim 11, wherein on the condition that the delta value is greater than the delta overshoot threshold, the encoder is configured to store the first counter value in a pointer field of the packet header.

13. The LIDAR system of claim 2, wherein:
the plurality of subsequent multibit ADC samples includes a first subsequent multibit ADC sample adjacent to the initial multibit ADC sample, and the plurality of delta data units include a first delta data unit adjacent to the initial data unit, and
the encoder is configured to:
calculate a first delta value based on a difference between the first subsequent multibit ADC sample and the initial multibit ADC sample,
compare the first delta value to a delta overshoot threshold,
on a condition that the first delta value is greater than the delta overshoot threshold, store a full bitwidth of the first delta value in the first delta data unit, and
on a condition that the first delta value is equal to or less than the delta overshoot threshold, store a reduced bitwidth of the first delta value in the first delta data unit.

14. The LIDAR system of claim 13, wherein:
the compressed data packet includes a packet header comprising an overshoot counter field,
the encoder includes a second counter that increments and stores a second counter value that corresponds to a total number of detected delta overshoots,
the encoder stores the second counter value in the overshoot counter field, and
on the condition that the first delta value is greater than the delta overshoot threshold, the encoder is configured to increment the second counter and store the second counter value in a pointer field of the packet header.

15. The LIDAR system of claim 13, wherein:
the plurality of subsequent multibit ADC samples includes a second subsequent multibit ADC sample adjacent to the first subsequent multibit ADC sample, and the plurality of delta data units include a second delta data unit adjacent to the first delta data unit, and
the encoder is configured to:
calculate a second delta value based on a difference between the first subsequent multibit ADC sample and the second subsequent multibit ADC sample,
compare the second delta value to the delta overshoot threshold,
on a condition that the second delta value is greater than the delta overshoot threshold, store a full bitwidth of the second delta value in the second delta data unit, and
on a condition that the second delta value is equal to or less than the delta overshoot threshold, store a reduced bitwidth of the second delta value in the second delta data unit.

16. The LIDAR system of claim 2, further comprising:
a system controller configured to receive the compressed data packet from the communication interface, wherein the system controller includes a decoder configured to derive the sequence of multibit ADC data samples from the plurality of data units of the compressed data packet.

17. A method of encoding Light Detection and Ranging (LIDAR) data, the method comprising:
generating, by a photodetector array, a plurality of electrical signals based on receiving a reflected light beam;
reading out the plurality of electrical signals from the photodetector array using a plurality of readout channels, each comprising a different multibit analog-to-digital converter (ADC) of a plurality of multibit ADCs;
converting, by the plurality of multibit ADCs, the plurality of electrical signals into a plurality of multibit ADC data samples that make up a sequence of multibit ADC data samples; and
encoding the sequence of multibit ADC data samples to generate a compressed data packet.

18. The method of claim 17, wherein:
the sequence of multibit ADC data samples includes an initial multibit ADC sample and a plurality of subsequent multibit ADC samples that are subsequent to the initial multibit ADC sample, and
the compressed data packet comprises a plurality of data units including an initial data unit and a plurality of delta data units subsequent to the initial data unit, wherein the initial data unit stores the initial multibit ADC sample.

19. The method of claim 18, wherein encoding the sequence of multibit ADC data samples comprises:
calculating a difference between different adjacent pairs of multibit ADC samples of the sequence of multibit ADC data samples to derive a corresponding delta value for each of the plurality of delta data units;
comparing each corresponding delta value to a delta overshoot threshold;
on a condition that the corresponding delta value is greater than the delta overshoot threshold, storing a full bitwidth of the corresponding delta value that corresponds to a delta data unit in the delta data unit; and
on a condition that the corresponding delta value is equal to or less than the delta overshoot threshold, storing a reduced bitwidth of the corresponding delta value in the delta data unit.

20. The method of claim 19, further comprising:
on the condition that the corresponding delta value is greater than the delta overshoot threshold:

incrementing a counter value of a delta overshoot counter indicating a total number of detected delta overshoots;
storing the counter value in an overshoot counter field of a packet header of the compressed data packet; and
storing a position value of the delta data unit at which a detected delta overshoot occurred in a pointer field of the packet header.

* * * * *